(12) United States Patent
McTigue

(10) Patent No.: US 6,864,694 B2
(45) Date of Patent: Mar. 8, 2005

(54) VOLTAGE PROBE

(75) Inventor: Michael Thomas McTigue, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 179 days.

(21) Appl. No.: 10/284,832

(22) Filed: Oct. 31, 2002

(65) Prior Publication Data

US 2004/0085057 A1 May 6, 2004

(51) Int. Cl.⁷ .............................................. G01R 31/02
(52) U.S. Cl. ..................... 324/724; 324/72.5; 324/149
(58) Field of Search ................. 324/724, 72.5, 324/149, 754, 690, 696; 29/825, 828, 854; 439/482, 912

(56) References Cited

U.S. PATENT DOCUMENTS

| | | | | |
|---|---|---|---|---|
| 5,348,397 A | * | 9/1994 | Ferrari | 374/185 |
| 6,700,079 B2 | * | 3/2004 | Bogursky et al. | 174/268 |
| 6,724,208 B2 | * | 4/2004 | Matsunaga et al. | 324/761 |

* cited by examiner

Primary Examiner—Vincent Q. Nguyen

(57) ABSTRACT

A voltage probe includes a signal lead that is configured to be soldered to a probing location in a device that is to be probed by the voltage probe, and a first cable that is coupled to the signal lead and that is configured to conduct an output signal that is responsive to an input signal that is received by the signal lead from the device. The signal lead has a thermal conductivity of less than 200 Watts per meter Kelvin (W/mK). Methods and other systems for providing electrical connections to devices under test are disclosed.

20 Claims, 5 Drawing Sheets

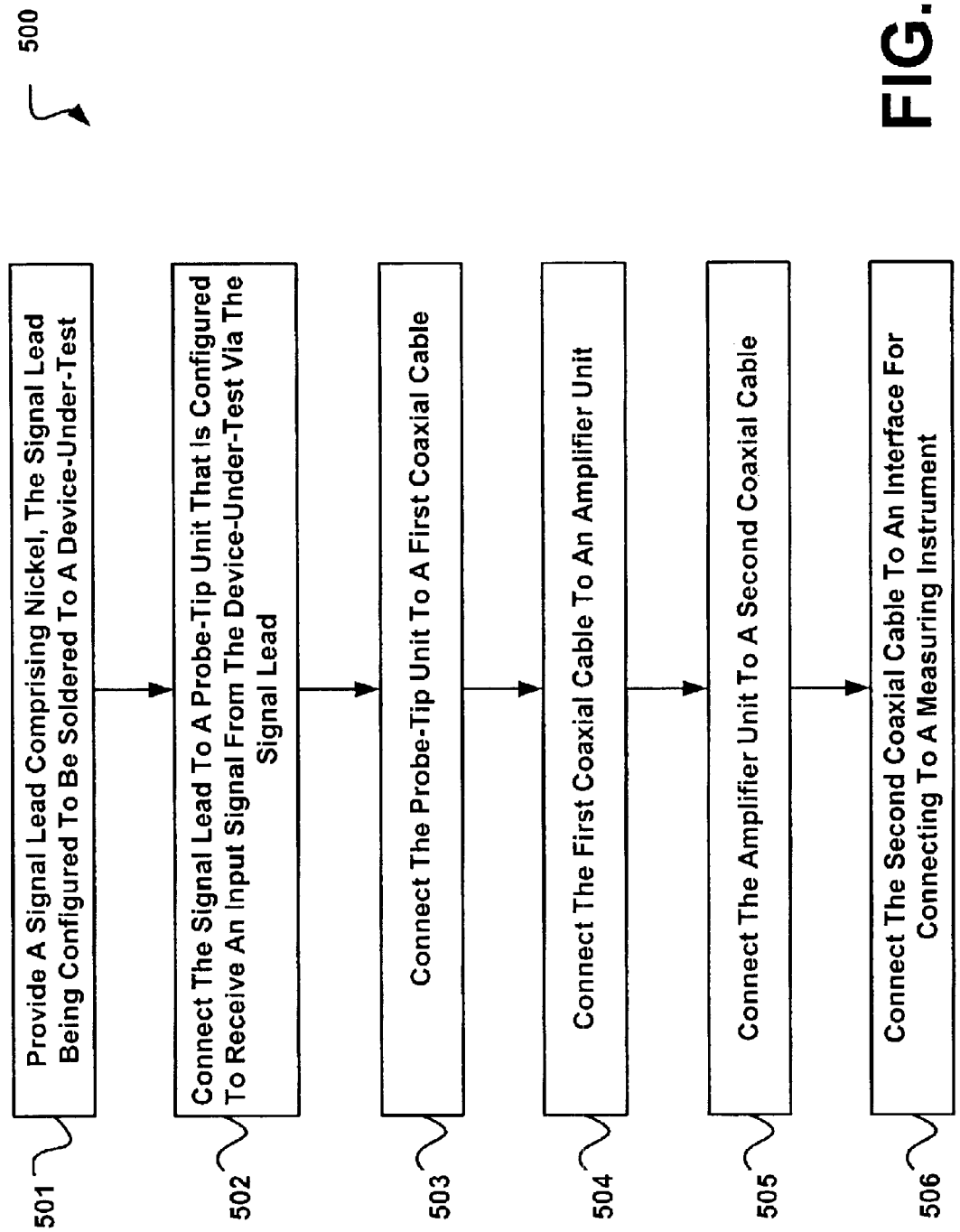

US 6,864,694 B2

VOLTAGE PROBE

FIELD OF THE INVENTION

This invention relates generally to devices used in electronic measurement and testing. More specifically, the invention relates to voltage probes.

DESCRIPTION OF THE RELATED ART

Wide bandwidth voltage probes can be categorized into three general types: low-impedance passive probes, active probes, and high-impedance passive probes. The most commonly used type of wide bandwidth voltage probe is the high-impedance passive probe. This probe type is rugged, reliable, simple to use, and inexpensive. For relatively low-frequency signals, including DC signals, these probes can present a very high-impedance load to the circuit under test. However, connecting this probe to a high-frequency signal can attenuate the signal's higher frequency components, thereby distorting the signal.

The simplest type of probe for high-bandwidth signals is the low-impedance, or low-Z, probe. This type of probe typically employs a 50 ohm coaxial cable that is connected to a 50 ohm input of the test instrument. The low-impedance passive probe type is rugged, reliable, and relatively inexpensive. It is also capable of very high bandwidth (well into the GHz frequency range). A drawback of this probe type is the significant load that it introduces to the circuit under test. This load can significantly alter the test signal, perhaps enough to cause a malfunction in the circuit being tested. The low-impedance probe type is normally used only when a very high bandwidth is required and only for circuits that can tolerate the significant resistive load of these probes.

An active probe incorporates an amplifier circuit and provides a much higher input impedance than that of the low-impedance probe type. This input impedance corresponds to a relatively high resistance resistor that is in parallel with a small capacitance capacitor. Because of this capacitance, which may be on the order of 1 pF, the load impedance of the active probe is frequency dependent—being lower for the higher frequency components of a test signal. One advantage of the active probe is that it has a higher bandwidth capability than a high-impedance passive probe.

A voltage probe (e.g., a low-impedance, high impedance, or active-type probe) may be connected to a device-under-test by soldering a signal lead of the voltage probe to a probing point in the device-under-test. The soldering of the signal lead to the probing point can provide a secure connection between the voltage probe and the device-under-test and may thus facilitate the testing of the device-under-test. However, one drawback to this approach is that heat generated from the soldering process may damage one or more components of the voltage probe and/or may cause a soldered connection within the voltage probe to disintegrate. As a result, the voltage probe may need to be repaired prior to being capable of providing accurate results. Based on the foregoing, it should be understood that there is a need for systems and/or methods that address these and/or other perceived shortcomings of the prior art. For instance, there exists a need for voltage probes that are more resistant to being damaged as a result of their signal leads being soldered to devices-under-test.

SUMMARY

Systems and methods for providing electrical connections to devices under test are disclosed. In one embodiment, a voltage probe includes a signal lead that is configured to be soldered to a probing location in a device that is to be probed by the voltage probe, and a cable that is coupled to the signal lead and that is configured to conduct an output signal that is responsive to an input signal that is received by the signal lead from the device. The signal lead has a thermal conductivity of less than 200 Watts per meter Kelvin (W/mK).

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following drawings. The components in the drawings are not necessarily drawn to scale, emphasis instead being placed upon clearly illustrating the principles of the present invention. In the drawings, like reference numerals designate corresponding parts throughout the several views.

FIG. 5 is a flow chart depicting a non-limiting example of a method for manufacturing an embodiment of a voltage probe, according to the invention.

DETAILED DESCRIPTION

Figure 1:
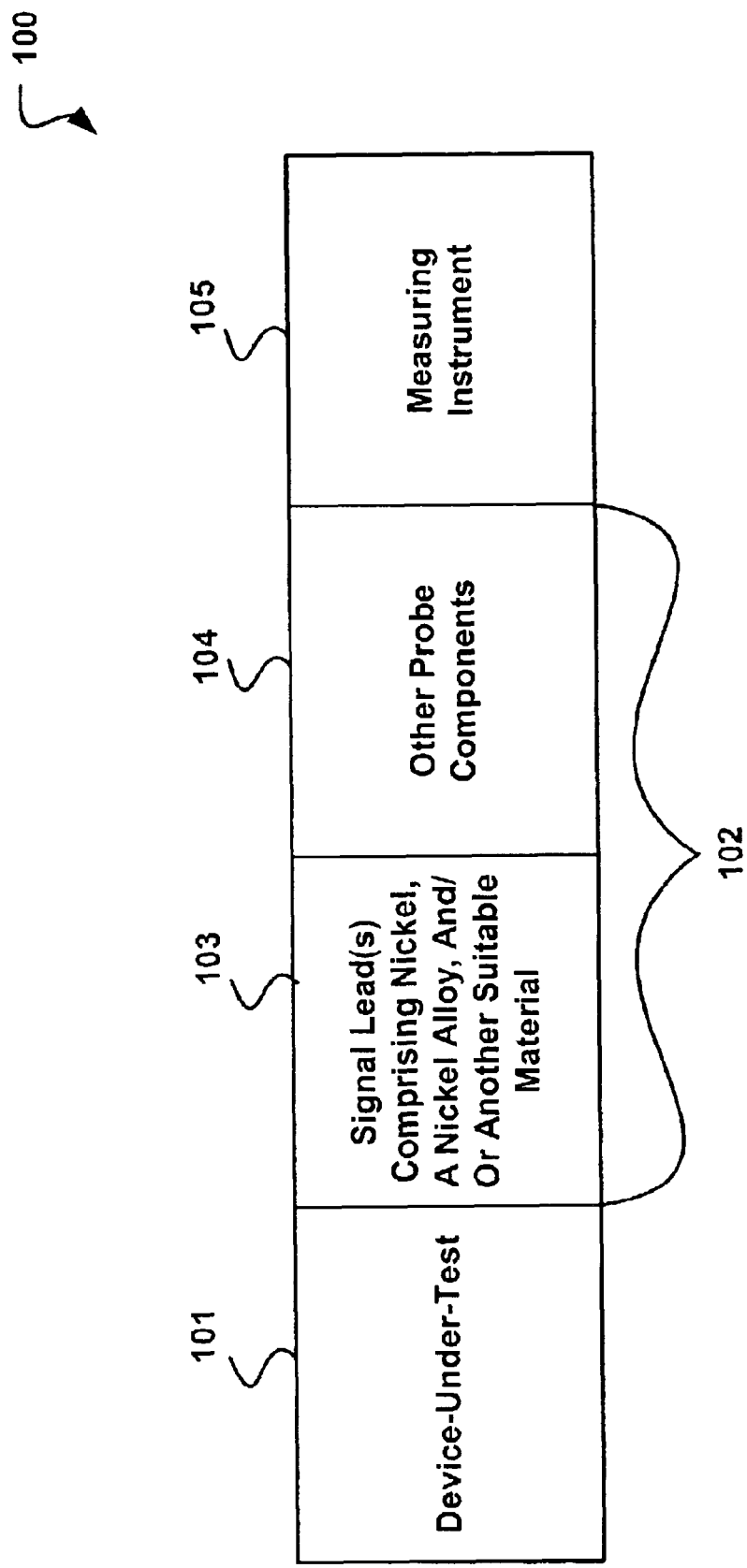
FIG. 1 is a simplified block diagram depicting an embodiment of a measurement system according to the present invention.

FIG. 1 is a simplified block diagram depicting an embodiment of a measurement system 100 according to the present invention. The measurement system 100 includes a probe 102 (which may be any active or a passive-type probe) that is coupled between a measuring instrument 105 and a device-under-test 101. The probe 102 may be configured to provide the measuring instrument 105 with one or more input signals received by the probe 102 from the device-under-test 101. Alternatively, the probe 102 may be configured to provide the measuring instrument 105 with one or more probe signals that are responsive to one or more input signals received by the probe 102 from the device-under-test 101. For example, the probe 102 may provide the measuring instrument 105 with a probe signal that is a modified version of an input signal that is received by the probe 102 from the device-under-test 101, or with a probe signal that is generated based on input signals received by the probe 102 from the device-under-test 101.

The measuring instrument 105 is configured to measure one or more characteristics of the probe signal(s) that the measuring instrument 105 receives from the probe 102. The measuring instrument 105 may be, for example, an oscilloscope, a spectrum analyzer, a logic analyzer, a vector analyzer, a network analyzer, or a time interval analyzer, among others. The device-under-test 101 may be, for example, an electronic device or circuit that is to be tested. The probe 102 includes one or more signal leads 103 and other probe components 104. A signal lead 103 is connected to the device-under-test 101, and is preferably a wire comprising nickel or a nickel alloy. Nickel is a conductor that has a relatively low thermal conductivity (e.g., as compared to copper), and, when formed as a wire, can be repeatedly bent without being easily susceptible to breaking.

A signal lead 103 comprising nickel can be soldered to a device-under-test 101 without excessive heat from the soldering process being conducted to one of the other probe components 104 (e.g., a damping resistor) or to a soldered junction within the probe 102 (e.g., between a signal lead 103 and another probe component or between two or more of the other probe components 104). Limiting the amount of heat conducted from the soldering process via the signal lead 103 protects one or more of the other probe components 104 from being damaged and/or prevents a soldered junction within the probe 102 from disintegrating.

In another embodiment, a signal lead 103 may be a wire comprising another metal or a metal alloy that has thermal conductivity of less than 200 Watts per meter Kelvin (W/mK) (preferably even less than 100 W/mK). The metal or metal alloy also preferably has certain physical properties whereby, when formed into a wire, the metal or metal alloy is capable of being repeatedly bent without being easily susceptible to breaking, and is capable of being securely soldered to a device-under-test 101.

Figure 2:
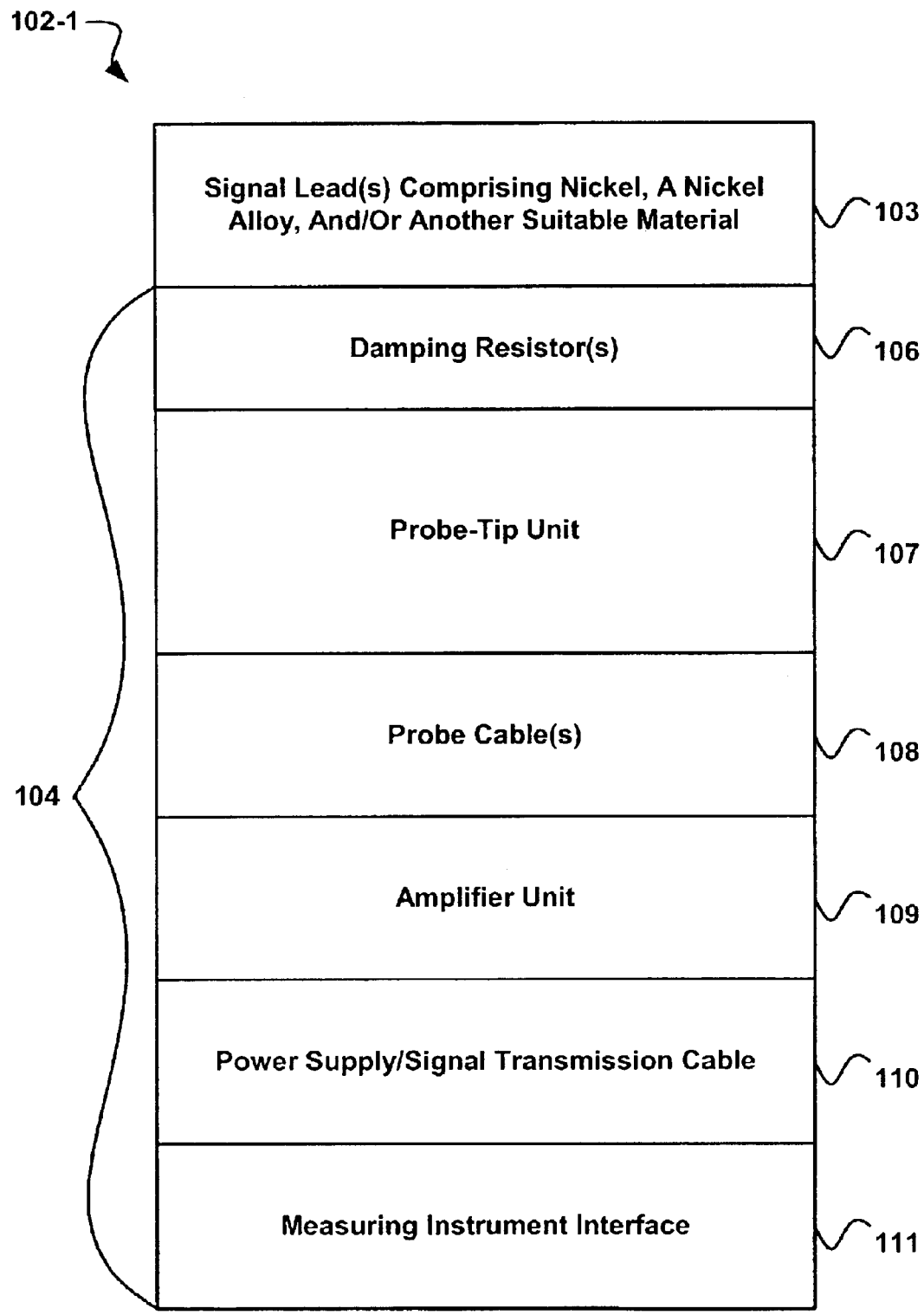
FIG. 2 is a simplified block diagram depicting an embodiment of an arrangement of selected components of a probe according to the present invention.

FIG. 2 is a simplified block diagram depicting an embodiment of an arrangement of selected components of an active probe 102-1 according to the present invention. The active probe 102-1 includes one or more signal leads 103 comprising a metal or metal alloy as described above (e.g., nickel). A signal lead 103 may be connected at one end to a damping resistor 106. At its other end, a signal lead 103 is configured to be connected (e.g., by being soldered) to a probing point in a device-under-test 101 (FIG. 1). In one implementation, a signal lead 103 maybe manufactured as part of a damping resistor 106; for example, a signal lead 103 may be one of the connecting wires of the damping resistor 106.

A probe-tip unit 107 which receives one or more signals from a device-under-test 101 via the damping resistor 106, launches the signal(s) onto respective probe cable(s) 108. The probe-tip unit 107 may comprise a printed circuit board that includes a few electronic components (e.g., a resistor and a capacitor coupled in parallel). In one embodiment, the probe-tip unit 107 converts a voltage input signal received from a device-under-test 101 to a current signal that is suitable for the amplifier unit 109. The probe cable(s) 108, which may comprise a coaxial cable, is/are preferably short, thin, and flexible (e.g., as compared to a power supply/signal transmission cable (PSSTC) 110). Such qualities of the probe cable(s) 108 permit movement of the amplifier unit 109 and/or the PSSTC 110 without disturbing a connection between a signal lead 103 and a device-under-test 101.

The probe cable(s) 108 is/are connected to an amplifier unit 109 that buffers the signal(s) received from the probe cable(s) 108 and that launches an output signal onto the PSSTC 110. The PSSTC 110 is connected between the amplifier circuit 109 and a measuring instrument interface 111, and includes a main coaxial cable for conducting an output signal toward a measuring instrument 105. The measuring instrument interface 111 connects the PSSTC 110 to the measuring instrument 105.

Figure 3:
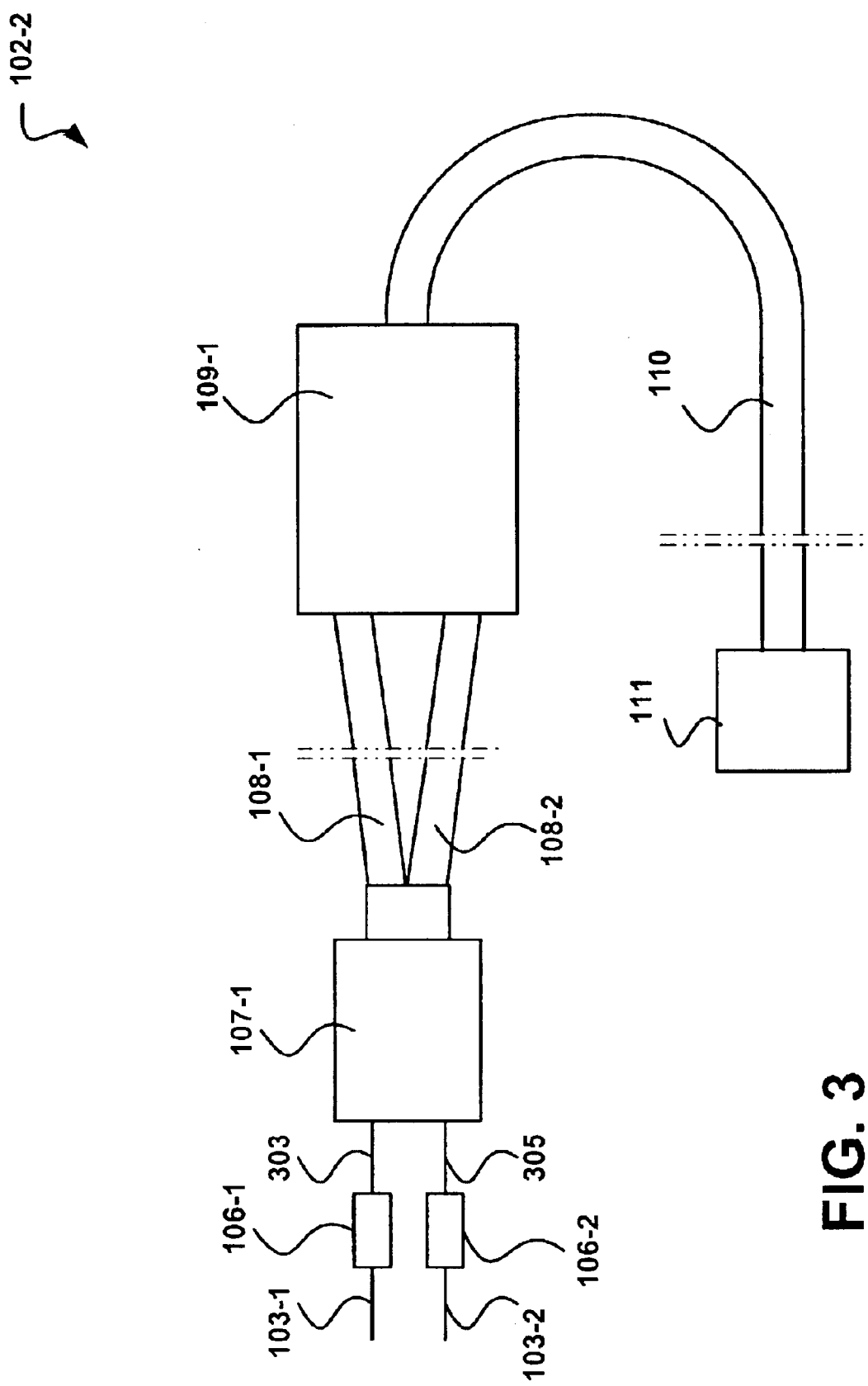
FIG. 3 is a schematic diagram depicting a differential probe that represents one embodiment of the probe modeled in FIG. 2.

FIG. 3 is a schematic diagram depicting a differential probe 102-2 that represents one embodiment of the probe 102 modeled in FIG. 2. The differential probe 102-2 includes signal leads 103-1 & 103-2 that are connected to respective damping resistors 106-1 and 106-2. The signal leads 103-1 & 103-2 may be connected (e.g., soldered) to probing points in a device-under-test 101 (FIG. 1). A differential probe-tip unit 107-1 is connected to the resistors 106-1 and 106-2 via connections 303 and 305, respectively. In one embodiment, the signal lead 103-1 and the connection 303 may be manufactured as part of a resistor component that includes the damping resistor 106-1. Similarly, the signal lead 103-2 and the connection 305 may be manufactured as part of a resistor component that includes the damping resistor 106-2. The signal leads 103-1 and 103-2, and the connections 303 and 305 preferably comprise nickel, a nickel alloy, and/or another metal or metal alloy that has the thermal and physical properties described above in connection with FIG. 1.

The differential probe-tip unit 107-1 is relatively small and lightweight (e.g., as compared to the amplifier unit 109-1), thereby facilitating attaching (e.g., through soldering) the differential probe-tip unit 107-1 to the probing points (not shown) of a device-under-test 101 (FIG. 1). The differential probe-tip unit 107-1 is connected via cables 108-1 and 108-2 to a differential amplifier unit 109-1. The differential amplifier unit 109-1 may include amplifying circuitry (not shown) for enabling high bandwidth (e.g., over 4 GHz) signal reception.

Each of the probe cables 108-1 & 108-2 may include cable insulation or sheathing that houses one or more types of conductors, including, for example, a coaxial cable. The probe cables 108-1 & 108-2 preferably offer relatively little resistance to being flexed as compared to, for example, the PSSTC 110. The high flexibility of the probe cables 108-1 & 108-2 facilitates handling of the differential amplifier unit 109-1 without causing substantial movement of a connected probe-tip unit 107-1.

The differential amplifier unit 109-1 is connected via the PSSTC 110 to a measuring instrument interface 111. The PSSTC 110 may include cable insulation or sheathing that houses various conductors. For example, the PSSTC 110 may comprise a main coaxial cable for transmitting output signals to a measuring instrument 105 (FIG. 1). Additionally, the PSSTC 110 may comprise one or more power conductors that are configured to provide direct current (DC) electrical power from the measuring instrument 105 to the differential amplifier unit 109-1. Thus, for example, the power conductors may include a positive conductor, a negative conductor, and a ground conductor. The PSSTC 110 may additionally include other conductors for various purposes such as, for example, to transmit control signals to/from the differential amplifier unit 109-1.

Figure 4:
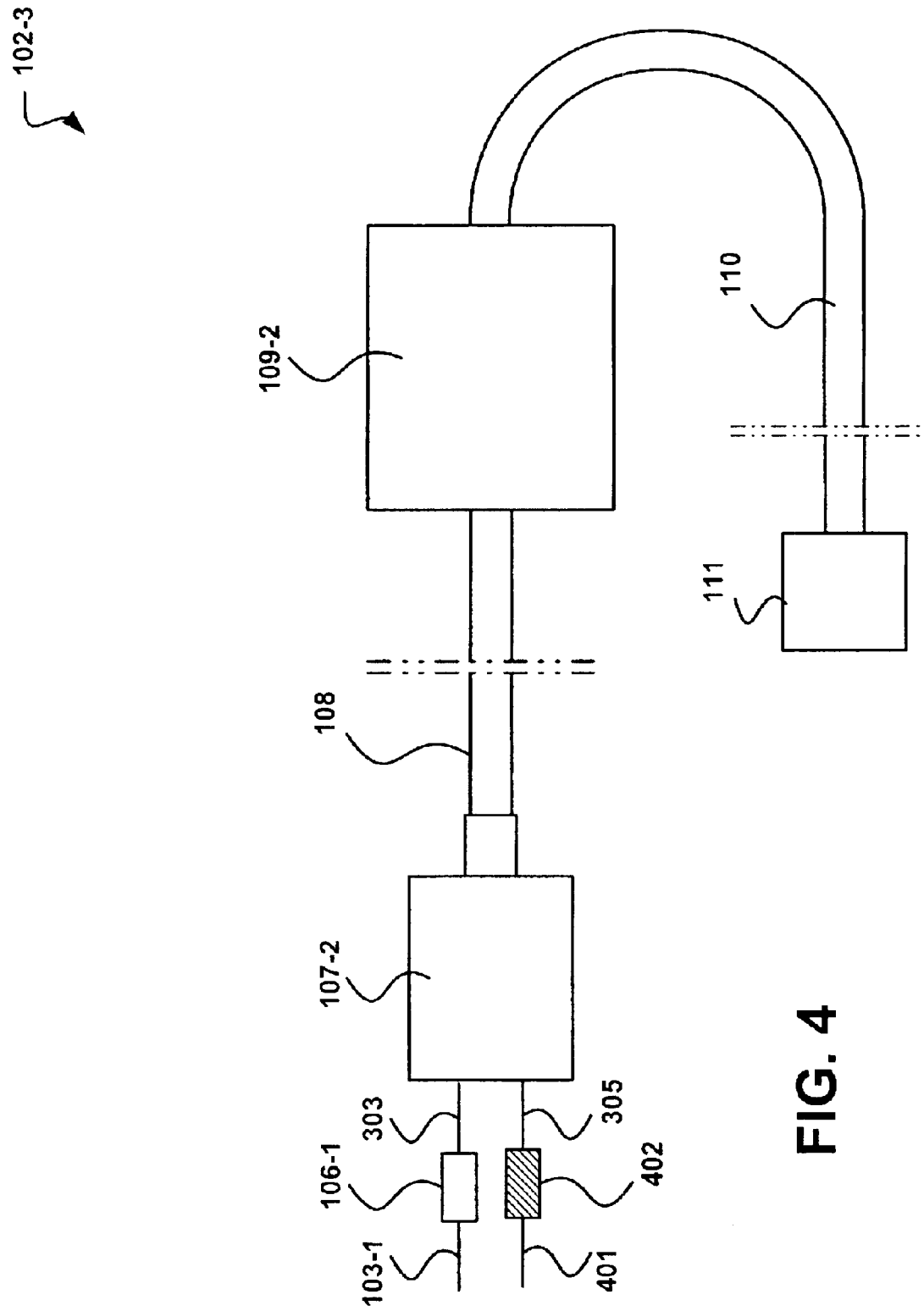
FIG. 4 is a schematic diagram depicting a probe that represents another embodiment of the probe modeled in FIG. 2.

FIG. 4 is a schematic diagram depicting a probe 102-3 that represents another embodiment of the probe 102 depicted in FIG. 2. The probe 102-3 includes a signal lead 103-1 that is connected to a damping resistor 106-1. The signal lead 103-1 may be connected (e.g., soldered) to a probing point in a device-under-test 101 (FIG. 1). The damping resistor 106-1 is connected to a probe-tip unit 107-2 via a connection 303. The signal lead 103-1 and the connection 303 may be manufactured as part of a resistor component that includes the damping resistor 106-1.

The probe 102-3 also includes a ground lead 401 that is connected to a zero-ohm resistor 402. The ground lead 401 is configured to be connected (e.g., soldered) to a point having zero potential (e.g., a ground terminal). The zero-ohm resistor 401, which is connected to the probe-tip unit 107-2 via a connection 305, facilitates the physical handling of the ground lead 401. The ground lead 401 and the connection 305 may be manufactured as part of a resistor component that includes the zero-ohm resistor 401. In an alternative embodiment, a zero-ohm resistor 401 is not connected between the ground lead 401 and the probe-tip unit 107-2. Instead, the ground lead 401 is connected directly to the probe tip unit 107-2. The signal lead 103-1, ground lead 401, and connections 303 and 305 preferably comprise nickel, a nickel alloy, and/or another metal or metal alloy that has the thermal and physical properties described above in connection with FIG. 1.

The probe-tip unit 107-2 is relatively small and lightweight (e.g., as compared to the amplifier unit 109-2), thereby facilitating attaching (e.g., by soldering) the probe-tip unit 107-2 to a probing point of a device-under-test 101. The probe-tip unit 107-2 is connected via a cable 108 to the amplifier unit 109-2, which is in turn connected via a PSSTC 110 to a measuring instrument interface 111. The amplifier unit 109-2 may include amplifying circuitry (not shown) for enabling high bandwidth (e.g., over 4 GHz) signal reception.

FIG. 5 is a flow chart depicting a non-limiting example of a method 500 for manufacturing an embodiment of a voltage probe, according to the invention. Some or all of the steps 501–505 of method 500 may be performed out of the order shown, including substantially concurrently or in reverse order. The method 500 includes providing a signal lead comprising nickel, as indicated in step 501. The signal lead is preferably configured to be soldered to a device-under-test. In step 502, the signal lead is connected to a probe-tip unit configured to receive an input signal from the device-under-test via the signal lead. The probe-tip unit is connected to a first coaxial cable, which is in turn connected to an amplifier unit, as indicated in steps 503 and 504, respectively. The amplifier unit is connected to a second coaxial cable, as indicated in step 505. This second coaxial cable is connected to an interface for connecting the second coaxial cable to a measuring instrument, as indicated in step 506.

It should be emphasized that the above-described embodiments of the present invention are merely possible examples, among others, of the implementations, setting forth a clear understanding of the principles of the invention. Many variations and modifications may be made to the above-described embodiments of the invention without departing substantially from the principles of the invention. All such modifications and variations are intended to be included herein within the scope of the disclosure and present invention and protected by the following claims.

What is claimed is:

1. A voltage probe comprising:

a signal lead that is configured to be soldered to a probing location in a device that is to be probed by the voltage probe, said signal lead having a thermal conductivity of less than 200 Watts per meter Kelvin (W/mK); and a first cable that is coupled to the signal lead and that is configured to conduct an output signal that is responsive to an input signal that is received by the signal lead from the device;

wherein the voltage probe is configured to be connected to a measuring instrument.

2. The voltage probe of claim 1, further comprising a damping resistor that is coupled between the first cable and the signal lead, the damping resistor being operative to damp the input signal.

3. The voltage probe of claim 2, further comprising a probe-tip unit that is coupled between the damping resistor and the first cable, the probe-tip unit being operative to receive the input signal and to pass the input signal to an amplifier unit.

4. The voltage probe of claim 3, wherein the amplifier unit is coupled between the probe-tip unit and the first cable, and is operative to output the output signal.

5. The voltage probe of claim 1, further comprising a second cable that is coupled between the probe-tip unit and the amplifier unit, the second cable being operative to conduct the input signal.

6. The voltage probe of claim 1, wherein the signal lead comprises nickel.

7. The voltage probe of claim 1, wherein the signal lead comprises a nickel alloy.

8. The voltage probe of claim 1, wherein said signal lead has a thermal conductivity of less than 100 W/mK.

9. The voltage probe of claim 1, wherein the measuring instrument is one of an oscilloscope, a spectrum analyzer, a logic analyzer, a vector analyzer, a network analyzer, or a time interval analyzer.

10. The voltage probe of claim 1, wherein the first cable is a coaxial cable.

11. The voltage probe of claim 1, wherein the voltage probe is one of an active probe or a passive probe.

12. A voltage probe comprising:

a resistor component having a lead that is comprise nickel, the lead being configured to be soldered to a probing location in a device that is to be probed by the voltage probe; and a coaxial cable that is coupled to the resistor, and that is configured to conduct an output signal to a measuring instrument;

wherein the voltage probe is configured to be connected to the measuring instrument.

13. The voltage probe of claim 12, wherein the measuring instrument is one of an oscilloscope, a spectrum analyzer, a logic analyzer, a vector analyzer, a network analyzer, or a time interval analyzer.

14. The voltage probe of claim 13, further comprising a probe-tip unit that is coupled to the resistor component, the probe-tip unit being configured to receive an input signal from the device via the resistor component.

15. A voltage probe comprising:

means for receiving a signal from a device to be probed, said means being configured to be soldered to a probing location in the device to be probed, and having a thermal conductivity of less than 200 Watts per meter Kelvin (W/mK); and means for conducting an output signal that is responsive to an input signal received by the means for receiving, said means for conducting being coupled to said means for receiving;

wherein the voltage probe is configured to be connected to a measuring instrument.

16. The voltage probe of claim 15, wherein the means for receiving comprises nickel.

17. The voltage probe of claim 15, wherein the measuring instrument is one of an oscilloscope, a spectrum analyzer, a logic analyzer, a vector analyzer, a network analyzer, or a time interval analyzer.

18. A system comprising:

a voltage probe including a signal lead having a thermal conductivity of less than 200 Watts per meter Kelvin (W/mK), the signal lead being configured to be soldered to a probing location in a device that is to be probed by the voltage probe; and a measuring instrument that is coupled to the voltage probe.

19. The system of claim 18, wherein the signal lead comprises nickel.

20. The voltage probe of claim 18, wherein the measuring instrument is one of an oscilloscope, a spectrum analyzer, a logic analyzer, a vector analyzer, a network analyzer, or a time interval analyzer.

* * * * *